(12) United States Patent
Wang et al.

(10) Patent No.: US 9,145,677 B2
(45) Date of Patent: Sep. 29, 2015

(54) ELECTROMAGNETIC LOCK DROP CEILING FOR AISLE CONTAINMENT SYSTEM AND METHOD

(75) Inventors: Jinhui Wang, Shanghai (CN); Rong Long, Shanghai (CN); Yonghai Du, Shanghai (CN); Qiang Meng, Shanghai (CN); Yujian Fan, Taicang (CN); Yingrong Huang, Shanghai (CN); Qiang Li, Changzhou (CN)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 0 days.

(21) Appl. No.: 14/399,719

(22) PCT Filed: May 11, 2012

(86) PCT No.: PCT/CN2012/075364
§ 371 (c)(1),
(2), (4) Date: Nov. 7, 2014

(87) PCT Pub. No.: WO2013/166708
PCT Pub. Date: Nov. 14, 2013

(65) Prior Publication Data
US 2015/0113883 A1    Apr. 30, 2015

(51) Int. Cl.
*E04B 9/00* (2006.01)
*E04B 9/02* (2006.01)
(Continued)

(52) U.S. Cl.
CPC . *E04B 9/003* (2013.01); *E04B 1/92* (2013.01); *E04B 9/02* (2013.01); *E04B 9/06* (2013.01);
(Continued)

(58) Field of Classification Search
CPC ............... E04B 9/00; E04B 9/02; E04B 9/20; H05K 7/20; A47B 95/008; A47B 96/067; E05Y 2900/20
USPC ............ 52/1, 64–66, 69, 71, 239, 241, 243.1, 52/506.01, 506.05, 36.2, 36.4, 745.1, 52/745.06, 745.11, 745.14, 745.15, 52/745.16; 160/9, 160, 210; 47/17; 454/184; 361/46–49, 690–695; 165/121–122; 312/198, 245
See application file for complete search history.

(56) References Cited

U.S. PATENT DOCUMENTS 3,410,194 A    11/1968  Reusch
5,619,824 A     4/1997  Russell et al.
(Continued)

FOREIGN PATENT DOCUMENTS

CN    102150483 A    8/2011
CN    102272530 A   12/2011
DE       2454239 A    5/2009

OTHER PUBLICATIONS

International Search Report from corresponding PCT/CN2012/075364 dated Feb. 28, 2013.

*Primary Examiner* — Beth Stephan
(74) *Attorney, Agent, or Firm* — Lando & Anastasi LLP

(57) ABSTRACT

An air containment system (22) is configured to span an aisle (12) formed by two rows of racks (14,16) or by one row of racks (14) and a wall (56) to form a ceiling. The air containment system (22) includes a frame structure (24) configured to be supported by the two rows of racks (14,16) or by the one row of racks (14) and the wall (56). The air containment system (22) further includes at least one ceiling panel (30) releasably supported by the frame structure (24), and a lock assembly (64) coupled to the frame structure (24) and configured to release the at least one ceiling panel (30) upon detecting a predetermined condition. Embodiments of the air containment system (22) and methods for releasing ceiling panels (30) are further disclosed.

17 Claims, 9 Drawing Sheets

(51) Int. Cl.

| | |
|---|---|
| *H05K 7/20* | (2006.01) |
| *E04B 1/92* | (2006.01) |
| *E04B 9/06* | (2006.01) |
| *G08B 3/10* | (2006.01) |
| *G08B 5/36* | (2006.01) |
| *G08B 21/18* | (2006.01) |

(52) U.S. Cl.
CPC .. *G08B 3/10* (2013.01); *G08B 5/36* (2013.01); *G08B 21/182* (2013.01); *H05K 7/20836* (2013.01)

(56) References Cited

U.S. PATENT DOCUMENTS

| | | |
|---|---|---|
| 6,672,955 B2 | 1/2004 | Charron |
| 7,656,660 B2 * | 2/2010 | Hoeft et al. ............. 361/679.51 |
| 7,990,709 B2 * | 8/2011 | Campbell et al. ............. 361/696 |
| 8,037,644 B2 * | 10/2011 | Hall ................... 52/69 |
| 8,713,869 B1 * | 5/2014 | Eychaner et al. ............. 52/241 |
| 2006/0139877 A1 * | 6/2006 | Germagian et al. .......... 361/695 |
| 2006/0260338 A1 * | 11/2006 | VanGilder et al. ............ 62/259.2 |
| 2008/0291626 A1 * | 11/2008 | Nelson et al. ................. 361/696 |
| 2009/0107652 A1 * | 4/2009 | VanGilder et al. ............ 165/80.2 |
| 2009/0129015 A1 * | 5/2009 | Nobile ........................ 361/692 |
| 2009/0129016 A1 * | 5/2009 | Hoeft et al. .................... 361/694 |
| 2009/0173017 A1 * | 7/2009 | Hall ................... 52/69 |
| 2010/0061057 A1 * | 3/2010 | Dersch et al. ................. 361/690 |
| 2010/0277277 A1 * | 11/2010 | Green et al. ................. 340/5.72 |
| 2011/0108207 A1 * | 5/2011 | Mainers et al. ................. 160/87 |
| 2011/0271610 A1 * | 11/2011 | Cottuli et al. ................. 52/173.1 |
| 2011/0278998 A1 * | 11/2011 | Caveney et al. .............. 312/109 |
| 2011/0278999 A1 * | 11/2011 | Caveney et al. .............. 312/198 |
| 2012/0083197 A1 | 4/2012 | Rodriguez |
| 2012/0181906 A1 * | 7/2012 | Caveney ...................... 312/237 |
| 2012/0281352 A1 * | 11/2012 | Namek et al. ........... 361/679.46 |

\* cited by examiner

ELECTROMAGNETIC LOCK DROP CEILING FOR AISLE CONTAINMENT SYSTEM AND METHOD

This application is a U.S. National Stage Application and claims priority under 35 U.S.C. §371 to International Application No. PCT/CN2012/075364, filed May 11, 2012, which is hereby incorporated herein by reference in its entirety.

BACKGROUND OF THE INVENTION

1. Field of the Invention

The present disclosure relates to racks and enclosures, and more particularly to equipment used to contain and manage air used to cool data processing, networking and telecommunications equipment housed in equipment racks.

2. Discussion of Related Art

Equipment enclosures or racks for housing electronic equipment, such as data processing, networking and telecommunications equipment have been used for many years. Such racks are often used to contain and to arrange the equipment in large equipment rooms and data centers. In certain embodiments, an equipment storage rack can be an open configuration and can be housed within a rack enclosure, although the enclosure may be included when referring to a rack.

Over the years, a number of different standards have been developed to enable equipment manufacturers to design rack mountable equipment that can be mounted in standard racks manufactured by different manufacturers. A standard rack typically includes front mounting rails to which multiple units of electronic equipment, such as servers and CPUs, are mounted and stacked vertically within the rack. An exemplary industry-standard rack is approximately six to six-and-a-half feet high, by about twenty-four inches wide, and about forty inches deep. Such a rack is commonly referred to as a "nineteen inch" rack, as defined by the Electronics Industries Association's EIA-310-D standard.

Heat produced by rack-mounted equipment can have adverse effects on the performance, reliability and useful life of the equipment components. In particular, rack-mounted equipment, housed within an enclosure, may be vulnerable to heat build-up and hot spots produced within the confines of the enclosure during operation. The amount of heat generated by a rack of equipment is dependent on the amount of electrical power drawn by equipment in the rack during operation. In addition, users of electronic equipment may add, remove, and rearrange rack-mounted components as their needs change and new needs develop.

In certain configurations, data centers may be cooled by supplementing a data center's cooling system with computer room air conditioner ("CRAC") units that are positioned around the periphery of the data center room. In some embodiments, these CRAC units intake air from the fronts of the units and output cooler air upwardly toward the ceiling of the data center room. In other embodiments, the CRAC units intake air from near the ceiling of the data center room and discharge cooler air under a raised floor for delivery to the fronts of the equipment racks. In general, such CRAC units intake room temperature air (at about 72° F.) and discharge cold air (at about 55° F.), which is blown into the data center room and mixed with the room temperature air at or near the equipment racks. In other embodiments, or in additional embodiments, the CRAC units may be scalable and modular so that the units may be placed anywhere within the data center depending on the cooling requirements within the data center.

The rack-mounted equipment typically cools itself by drawing air along a front side or air inlet side of a rack, drawing the air through its components, and subsequently exhausting the air from a rear or vent side of the rack. In a certain embodiment, air is drawn through the equipment racks from a "cold" aisle, which is typically located at the fronts of the equipment racks. The heated air is exhausted from the equipment racks to a "hot" or "warm" aisle, which is typically located at the backs of the equipment racks. A disadvantage of the CRAC-type air conditioning system is that cool air is mixed with the room temperature air, which is inefficient. Ideally, to make the system as efficient as possible, and to utilize as little energy and floor space as possible, the highest possible temperature air should be drawn into the CRAC units and the outlet air generated by the CRAC should be a few degrees below room temperature. In addition, airflow requirements can vary considerably as a result of different numbers and types of rack-mounted components and different configurations of racks and enclosures.

In order to control the flow of air throughout the data center, and to optimize the air flow as described above, it may be desirable to contain the air within the hot and cold aisles, and in particular, the hot aisle. As a result, hot aisle containment systems have been developed to contain and manage air within the hot aisle. Cold air containment systems have been developed as well. One disadvantage associated with a typical hot aisle containment system is that a ceiling of the air containment system may block or otherwise prevent a sprinkler system of the data center from deploying during an emergency. Thus, such an air containment system often requires a separate sprinkler (suppression) system embedded within the air containment system.

SUMMARY OF THE INVENTION

One aspect of the disclosure is directed to an air containment system configured to span an aisle formed by two rows of racks or by one row of racks and a wall to form a ceiling. In one embodiment, the air containment system comprises a frame structure configured to be supported by the two rows of racks or by the one row of racks and the wall, at least one ceiling panel releasably supported by the frame structure, and a lock assembly coupled to the frame structure and configured to release the at least one ceiling panel upon detecting a predetermined condition.

Embodiments of the air containment system further may include configuring the frame structure to have a first elongate frame assembly extending along a length of a first row of racks, and a second elongate frame assembly extending along a length of a second row of racks or a wall. The frame structure further may include a first elongate support member hingedly connected to the first elongate frame assembly. In one embodiment, the lock assembly includes an electro-magnetic lock coupled to the first elongate support member and the first elongate frame assembly. The electro-magnetic lock may include a first portion secured to the first elongate support member and a second portion secured to the first elongate frame assembly. The first portion may include a base metal material that is attracted to a magnet, and the second portion includes a magnet that is capable of being selectively energized to attract to the first portion. In one embodiment, the air containment system further comprises a control module to control the operation of the electro-magnetic lock. The control module may be configured to move the electro-magnetic lock between a magnetized condition in which the electro-magnetic lock retains the first elongate support member in close proximity to the first elongate frame assembly and an de-magnetized condition in which the electro-magnetic lock disengages the first elongate support member to allow the first elongate support member to hingedly swing away from the first elongate frame assembly. In a certain embodiment, the air containment system further comprises an alarm coupled to the control module and configured to activate prior to when the electro-magnetic lock disengages the first elongate support member. The lock assembly further may include a mechanical fastener coupled to the first elongate support member and the first elongate frame assembly. The mechanical fastener may be configured to move between a locked condition in which the mechanical fastener retains the first elongate support member in close proximity to the first elongate frame assembly and an unlocked condition in which the mechanical fastener disengages the first elongate support member to allow the first elongate support member to hingedly swing away from the first elongate frame assembly. The mechanical fastener may include a retaining element secured to one of the first elongate frame assembly and the first elongate support member and a locking element secured to the other of the first elongate frame assembly and the first elongate support member. The frame structure further may include a second elongate support member hingedly connected to the second elongate frame assembly.

Another embodiment of the disclosure is directed to a method of releasing one or more ceiling panels upon detecting a predetermined condition. In one embodiment, the method comprises: providing an air containment system configured to span an aisle formed by two rows of racks or by one row of equipment racks and a wall to form a ceiling, the air containment system comprising a frame structure configured to be supported by the two rows of racks or by the one row of equipment racks and the wall, at least one ceiling panel releasably supported by the frame structure, and a lock assembly coupled to the frame structure and configured to release the at least one ceiling panel upon detecting a predetermined condition; detecting a predetermined condition; and releasing the at least one ceiling panel.

Embodiments of the method further may include identifying the predetermined condition as a temperature within the aisle greater than a set temperature or smoke detected within the aisle. In a certain embodiment, the set temperature is 135° F. The step of releasing the at least one ceiling panel may include hingedly moving the first elongate support member with respect to the first elongate frame assembly. In one embodiment, the lock assembly includes an electro-magnetic lock secured to the first elongate support member and the first elongate frame assembly. The step of releasing the at least one ceiling panel may include controlling the movement of the electro-magnetic lock between a magnetized condition in which the electro-magnetic lock retains the first elongate support member in close proximity to the first elongate frame assembly and a de-magnetized condition in which the electro-magnetic lock assembly disengages the first elongate support member to allow the first elongate support member to hingedly swing away from the first elongate frame assembly. In another embodiment, the method further comprises, prior to releasing the at least one ceiling panel, operating an alarm to warn individuals within the aisle. The alarm may include a visual alarm and/or a sound alarm.

The present disclosure will be more fully understood after a review of the following figures, detailed description and claims.

BRIEF DESCRIPTION OF THE DRAWINGS

In the drawings, each identical or nearly identical component that is illustrated in various figures is represented by a like numeral. For purposes of clarity, not every component may be labeled in every drawing. For a better understanding of the present disclosure, reference is made to the figures which are incorporated herein by reference and in which.

DETAILED DESCRIPTION OF THE PREFERRED EMBODIMENTS

Figure 1:
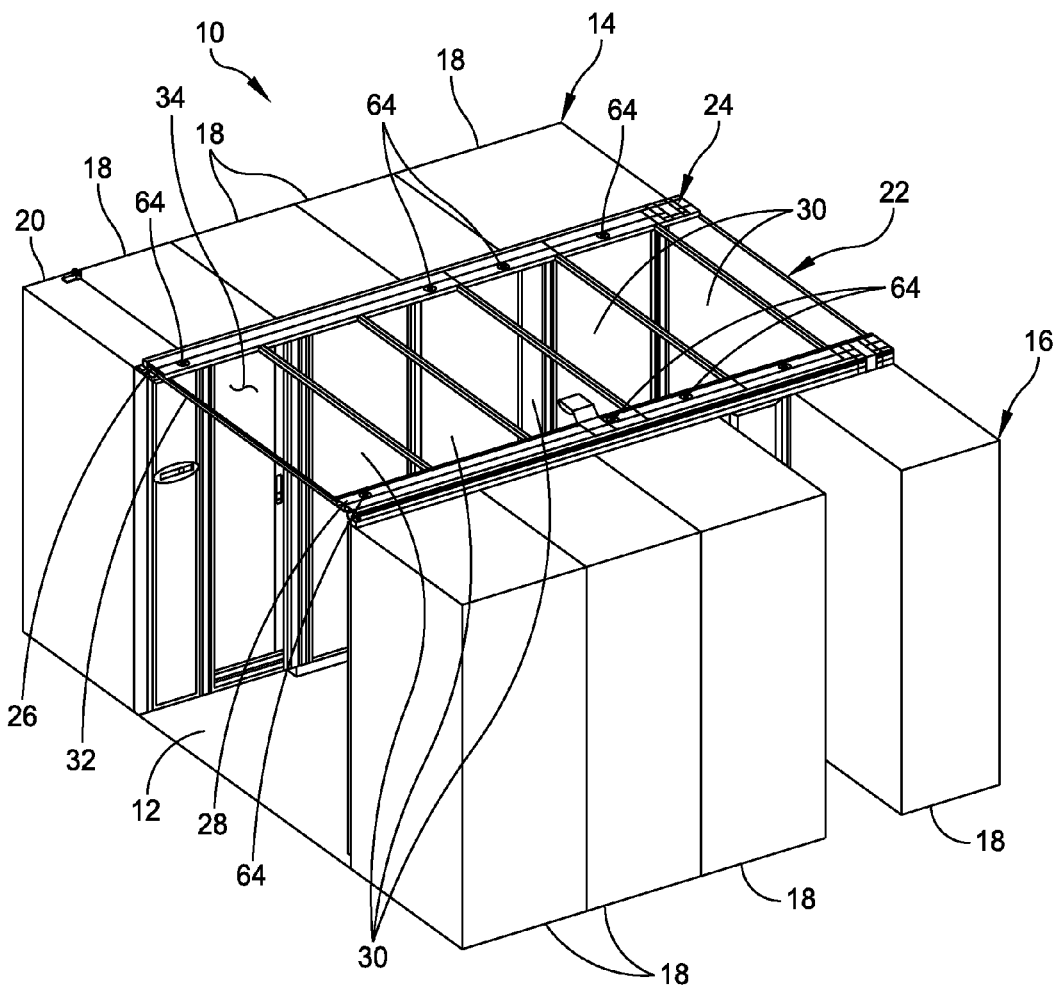
FIG. 1 is a top perspective view of an air containment system of an embodiment of the present disclosure that is configured to span an aisle formed by two rows of equipment racks.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The disclosure is capable of other embodiments and of being practiced or being carried out in various ways. Also the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

A typical data center may be designed to house a number of equipment racks, which are designed to house electronic equipment including but not limited to data processing, networking and telecommunications equipment. Each equipment rack may be configured to include a frame or housing adapted to support the electronic equipment. The housing includes a front, a back, opposite sides, a bottom and a top. The front of each equipment rack may include a front door so as to enable access into the interior of the equipment rack. The sides of the equipment rack may include one or more panels to enclose the interior region of the rack. The back of the equipment rack may also include one or more panels or a back door to provide access to the interior of the equipment rack from the back of the rack. In certain embodiments, the side and back panels, as well as the front door and the rear door, may be fabricated from perforated sheet metal, for example, to allow air to flow into and out of the interior region of the equipment rack. In other embodiments, the front door may include a removable panel.

The equipment racks are modular in construction and configured to be rolled into and out of position, e.g., within a row of the data center. Once in position, electronic equipment may be positioned in the interior region of the equipment rack. For example, the equipment may be placed on shelving secured within the interior region of the equipment rack. Cables providing electrical and data communication may be provided through the top of the equipment rack either through a cover (or "roof") at the top of the equipment rack having openings formed therein or through an open top of the equipment rack. In this embodiment, the cables may be strung along the roofs of the racks or be provided in the aforementioned cable distribution troughs. In another embodiment, the cables may be disposed within a raised floor and connected to the electronic equipment through the bottom of the equipment rack. With both configurations, power and communication lines are provided to the equipment racks.

As discussed above, data centers are typically configured with rows of equipment racks arranged such that cool air is drawn into the racks from a cool aisle and warm or hot air is exhausted from the racks into a hot aisle. In one embodiment, the equipment racks may be arranged in two rows with the fronts of the equipment racks in a near row being arranged in a forward direction and the backs of the equipment racks in a far row being arranged in a rearward direction. However, as stated above, in a typical data center, there may be multiple rows of equipment racks wherein the rows may be arranged with the fronts of the equipment racks facing one another to define the cold aisle and with the backs of the equipment racks facing one another to define the hot aisle. In other configurations, the hot or cold aisle may be disposed between a wall and a row of equipment racks. For example, a row of equipment racks may be spaced from a wall with the backs of the equipment racks facing the wall to define a hot aisle between the wall and the row of equipment racks.

In order to address the heat build-up and hot spots within the data center or equipment room, and to address climate control issues within the data center or room in general, a cooling system may be provided. In one configuration, the cooling system may be provided as part of the data center infrastructure. In another configuration, the data center's cooling system may be supplemented with the CRAC units described above. With yet another configuration, a modular cooling system may be provided in which modular cooling racks are interspersed within the rows of equipment racks.

In one embodiment, a management system may be provided to monitor and display conditions of the equipment racks, including the cooling racks. The management system may operate independently to control the operation of the equipment and cooling racks, and may be configured to communicate with a higher level network manager or with a management system associated with the data center. In certain circumstances, it may be desirable control the air flow within the hot and cold aisles, and in the hot aisles in particular. Typically, heat generated from electronic components housed within the equipment racks is exhausted out of the backs of the equipment racks into the hot aisles. It may be desirable to contain the hot air for conditioning by a cooling unit, such as the modular cooling unit described above. It is known to enclose the hot aisle with a ceiling assembly that is designed for the particular equipment rack configuration. Such ceiling assemblies are typically installed when installing the equipment racks in the data center and are manufactured by the manufacturers of the equipment racks. Known ceiling assemblies are awkward to lift overhead and install, and require precise spacing between the rows of equipment racks. Moreover, such ceiling assemblies may block or otherwise prevent a sprinkler system of the data center from deploying during an emergency. Thus, such ceiling assemblies often require a separate sprinkler or suppression system embedded within the assembly.

Embodiments of an air containment system of the present disclosure may include a plurality of panel assemblies configured to be arranged along the length of the aisle to form a ceiling over the aisle. In one embodiment, each panel assembly may include a frame structure having a ceiling panel releasably supported by the frame structure. This construction is easy to assembly and install, and enables the panel to be automatically released upon detecting elevated temperature in the data center. By releasing the panels, an automatic sprinkling system of the data center may be exposed to address the cause of the elevated temperature.

Referring now to the drawings, and more particularly to FIG. 1, a portion of a data center, generally indicated at 10, is illustrated. In particular, a hot aisle 12 located between two rows of equipment racks, generally indicated at 14, 16, is illustrated. The principles described herein may be applied to any aisle within the data center, including cold aisles. The hot aisle 12 is being shown for illustration purposes only. As shown, the first row of racks 14 is positioned so that the fronts of the racks face outwardly. Similarly, the second row of racks 16 is positioned so that the fronts of the racks face outwardly and the backs of the racks face the backs of the first row of racks 14. By way of example only, the first row of racks 14 includes four equipment racks, each indicated at 18, and one cooling rack, indicated at 20. The second row of racks 16 includes four equipment racks 18 with a space provided for receiving a rack, such as a cooling rack 20.

The arrangement is such that hot air is exhausted through the backs of the equipment racks 18 into the hot aisle 12 formed between the first row 14 and the second row 16. As discussed above, this aisle may sometimes be referred to herein as the "hot" or "warm" aisle. As shown in FIG. 1, air is capable of escaping from the hot aisle 12 above the equipment racks 18. As is well known, warm air rises, thus creating a situation in which the ceiling of the data center 10 may become too warm. This situation may negatively affect the climate control within the data center 10. An air containment system of an embodiment of the present disclosure is designed to control the flow of warm air within the data center 10, and within the space between the equipment racks 18 specifically.

Still referring to FIG. 1, an air containment system, generally indicated at 22, is provided to contain hot air within the hot aisle 12. As shown, the air containment system includes a frame structure, generally indicated at 24, which is designed to rest on top of the first and second rows 14, 16 and span the hot aisle 12. The frame structure 24 includes a first elongate frame assembly 26 that extends along the top edge of one row of equipment racks 14 and a second elongate frame assembly 28 that extends along the top edge of the other row of equipment racks 16. Depending on the length of the hot aisle 12, there may be additional first and second elongate frame assemblies 26, 28 to extend the length of the aisle. As shown in FIG. 1, there are several first and second elongate frame assembles 26, 28 that rest upon the equipment/cooling racks 18, 20 to extend along the length of the hot aisle 12. Although not shown, the frame structure 24 may include several cross support members that extend from the first elongate frame assembly 26 to the second elongate frame assembly 28.

The frame structure 24 is configured to support a plurality of ceiling panels, each indicated at 30. Each ceiling panel 30 is rectangular in shape having a width and a length sufficient to extend across the width of the aisle. For example, the width of the ceiling panel 30 may be selected to correspond to a width of the equipment or cooling rack 18, 20. In one embodiment, each ceiling panel 30 includes a generally rectangular frame 32 that is configured to support a transparent/translucent panel 34 to enable light to transmit into the hot aisle 12. In one embodiment, the frame 32 of each ceiling panel 30 is fabricated from any suitable lightweight material, such as metal or plastic, and the transparent/translucent panel 34 is fabricated from any suitable material capable of allowing light to pass through. In another embodiment, the transparent/translucent panel 34 may be fabricated from opaque material that blocks light from entering the hot aisle 12. As shown in FIG. 1, the frames 32 of adjacent ceiling panels 30 are placed closely to one another to contain the air within the hot aisle 12. Outer edges of the frames 32 may be adapted to seal the adjacent edges of the frames when placing the ceiling panels 30 next to each other. For example, a strip of material (not shown) may be applied to the outer edges of the frames 32 to assist in sealing the edges of the frames when deploying the ceiling panels 30.

Figure 2A:
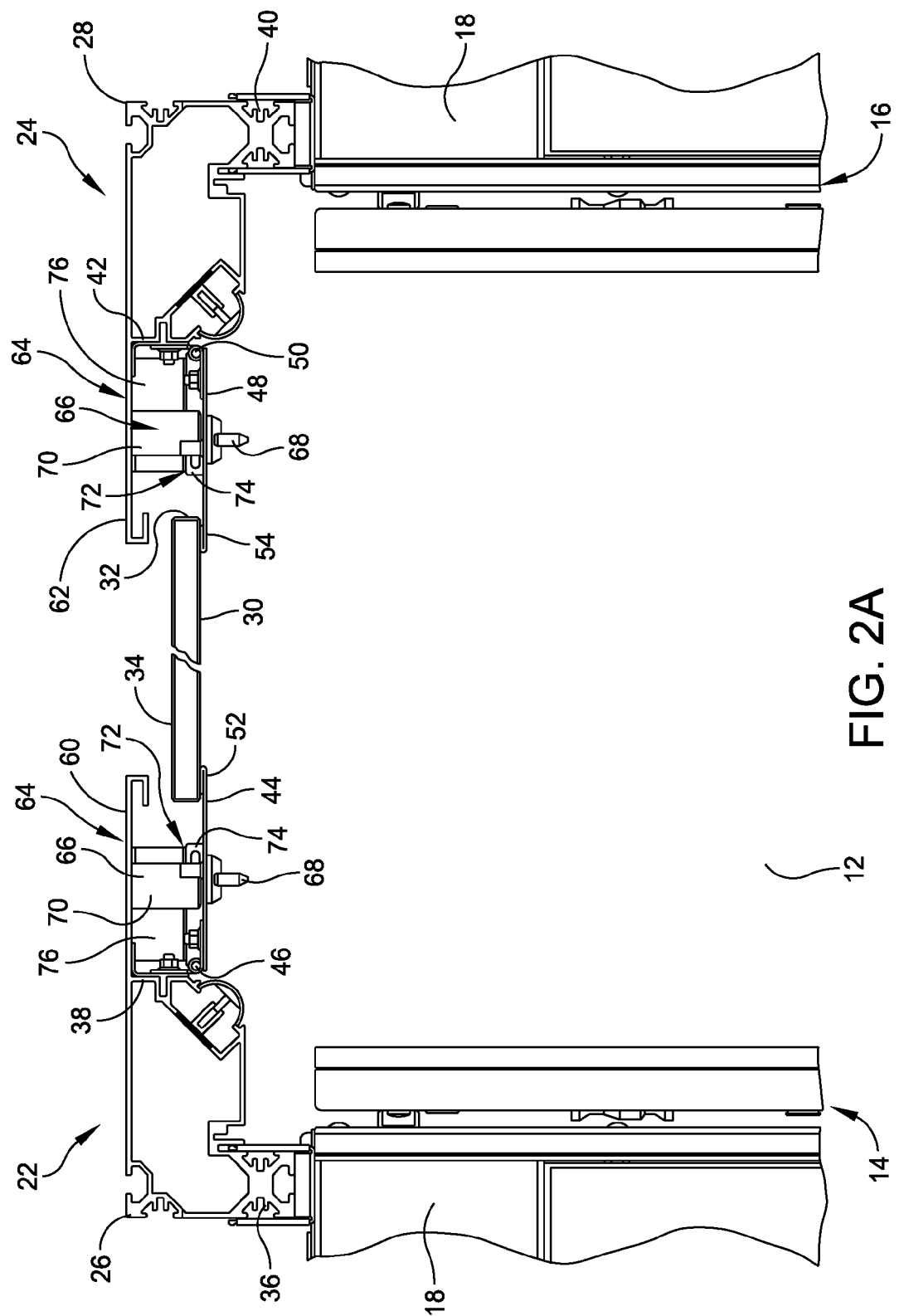
FIG. 2A is a cross-sectional view of the air containment system illustrated in FIG. 1 showing the air containment system supporting a ceiling panel.
Figure 2B:
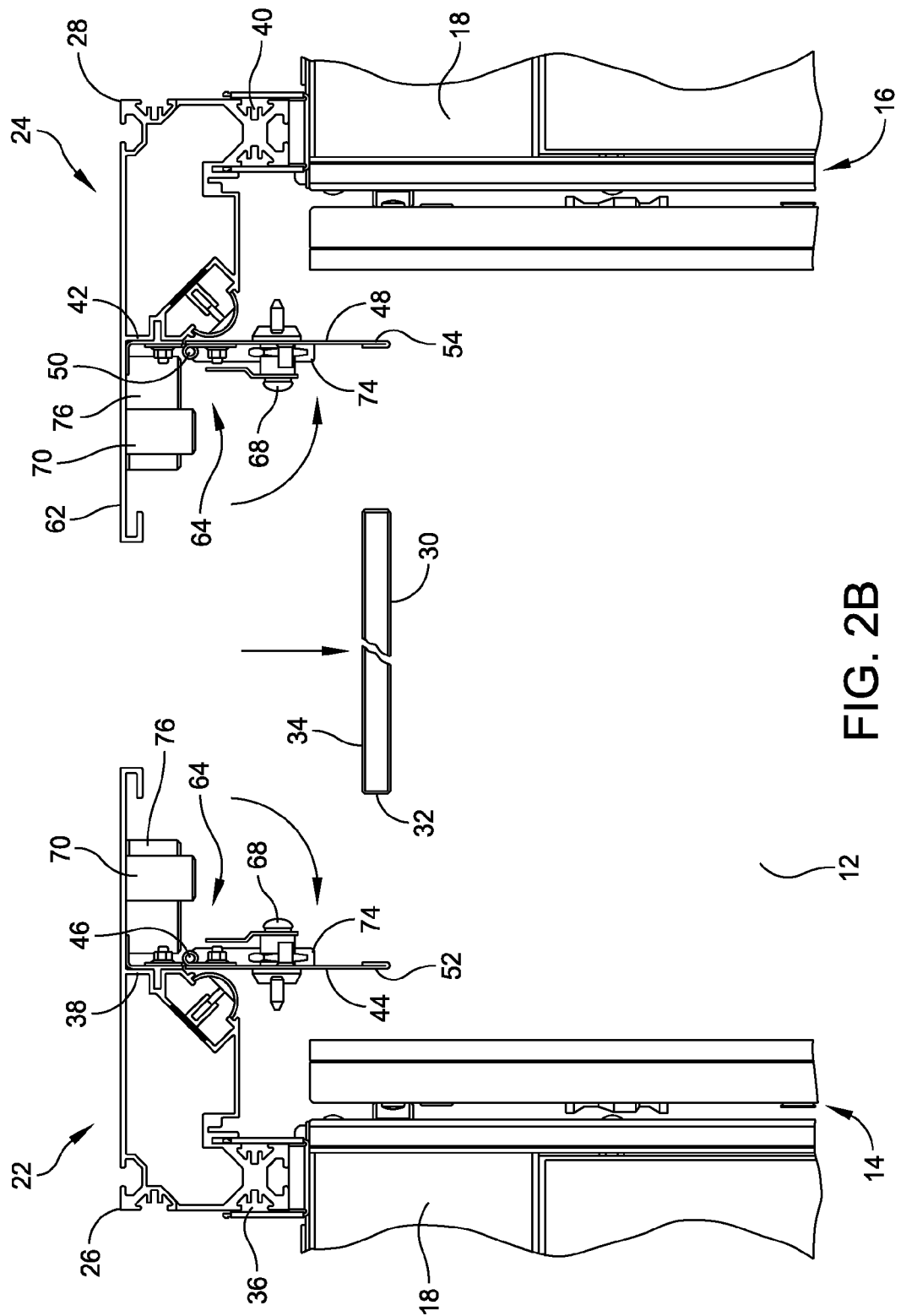
FIG. 2B is a cross-sectional view of the air containment system showing the air containment system releasing the ceiling panel.

Referring to FIGS. 2A and 2B, the air containment system 22 and portions of the first and second rows of racks 14, 16 shown in FIG. 1 are illustrated in cross-section. As shown, the construction of the second elongate frame assembly 28 is a mirror image of the construction of the first elongate frame assembly 26. As shown, the first elongated frame assembly 26 includes a first frame sub-assembly 36 that is supported by the first row of racks 14 along the length of the racks as viewed in FIG. 1, and a second frame sub-assembly 38 that extends away from the first frame sub-assembly toward the second row of racks 16. Similarly, the second elongated frame assembly 28 includes a third frame sub-assembly 40 that is supported by the second row of racks 16 along the length of the racks, and a fourth frame sub-assembly 42 that extends away from the third frame sub-assembly toward the first row of racks 14. Each of the first, second, third and fourth frame sub-assemblies 36, 38, 40, 42 are fabricated from structural components that are suitable for supporting the ceiling panels 30. For example, in one embodiment, the structural components of the first, second, third and fourth frame sub-assemblies 36, 38, 40, 42 are fabricated from suitable material, such as structural metal, e.g., aluminum.

The first elongate frame assembly 26 further includes a first elongate support member 44 that is secured to the second frame sub-assembly 38 by a hinge 46, which enables the first elongate support member to pivot with respect to the second frame sub-assembly. Similarly, the second elongate frame assembly 28 further includes a second elongate support member 48 that is secured to the fourth frame sub-assembly 42 by another hinge 50, which enables the second elongate support member to pivot with respect to the fourth frame sub-assembly. The construction of the first elongate frame assembly 26 and the second elongate frame assembly 28 enables the first elongate support member 44 and the second elongate support member 48 to move between generally horizontal conditions shown in FIG. 2A and generally vertical conditions shown in FIG. 2B. In the horizontal conditions (FIG. 2A), an edge 52 of the first elongate support member 44 supports an edge of the ceiling panel 30 on one side of the ceiling panel and an edge 54 of the second elongate support member 48 supports an edge of the ceiling panel on the other side of the ceiling panel.

Figure 2C:
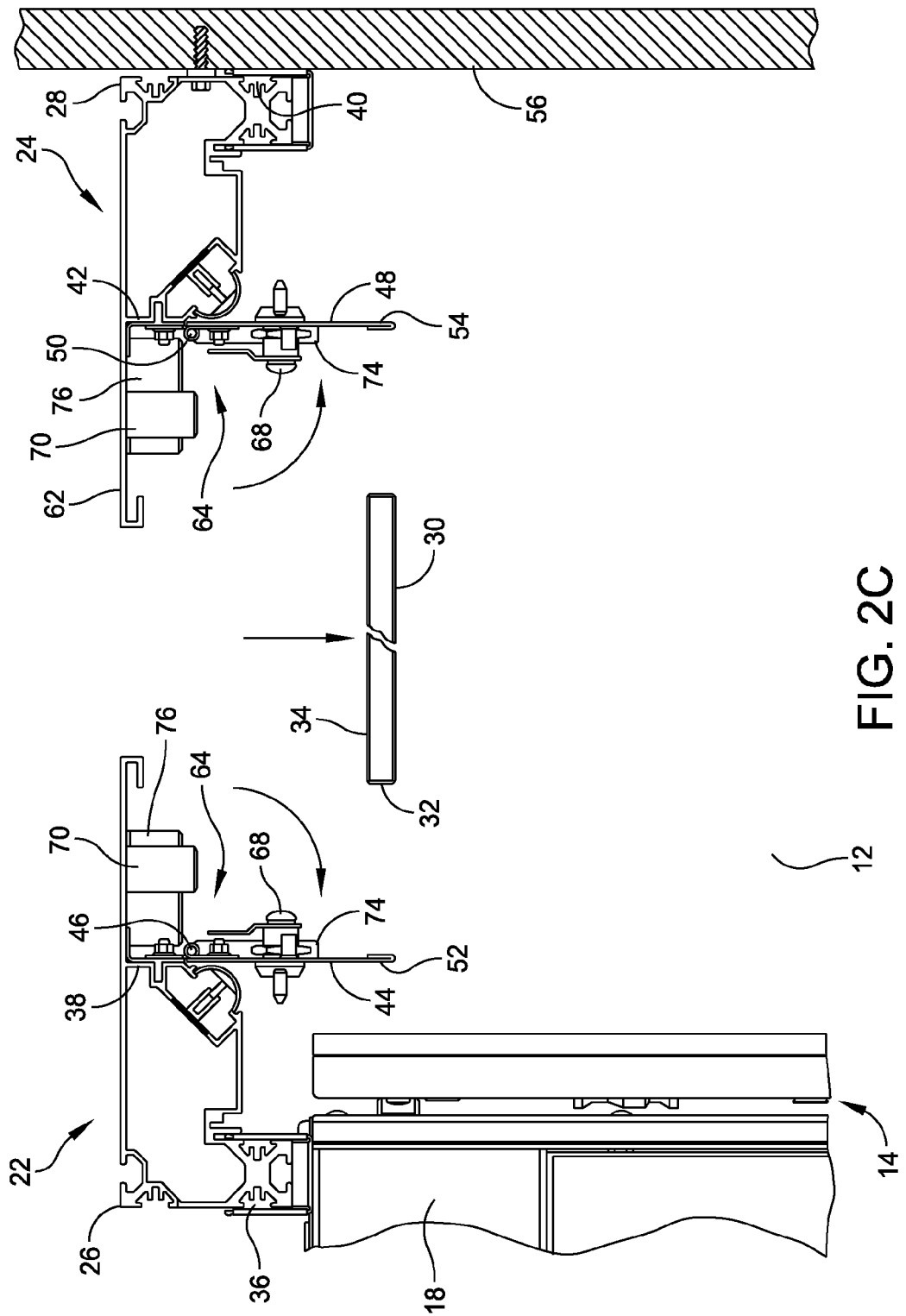
FIG. 2C is a cross-sectional view of the air containment system having one side of the system secured to a wall.
Figure 2D:
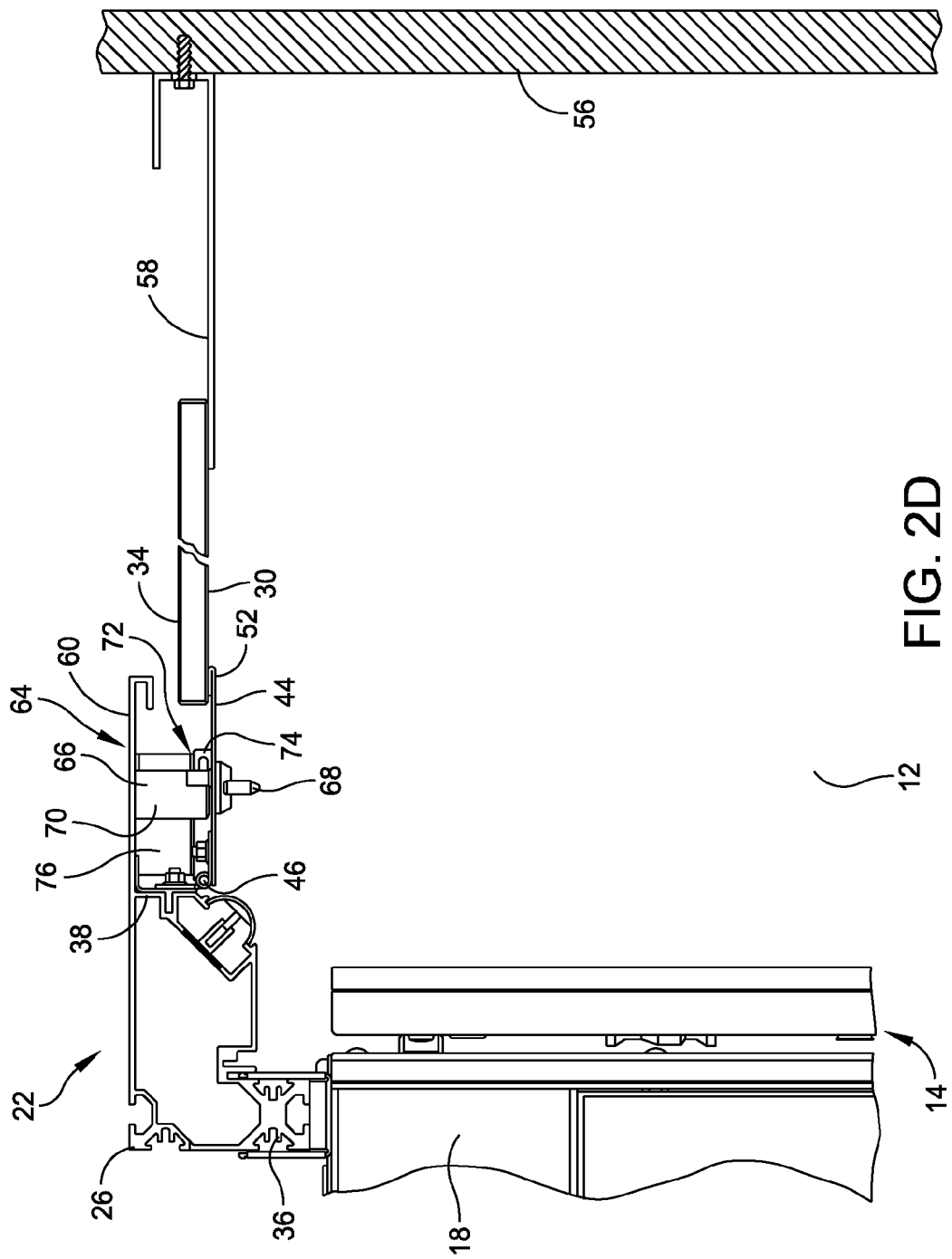
FIG. 2D is a cross-sectional view of the air containment system shown in FIG. 2C of another embodiment.
Figure 4:
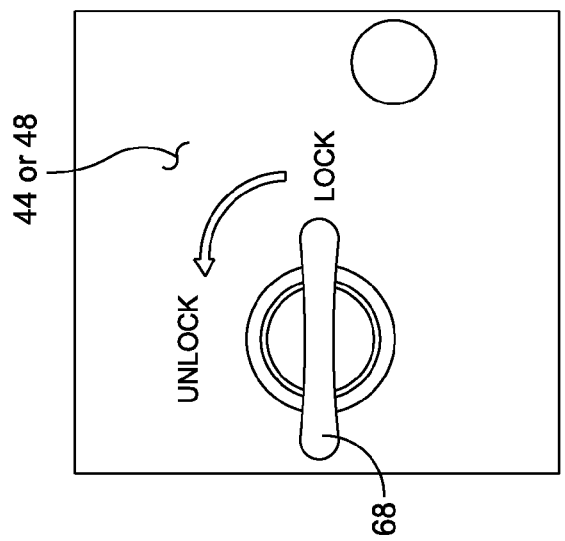
FIG. 4 is a bottom plan view of the fastener assembly.
Figure 3:
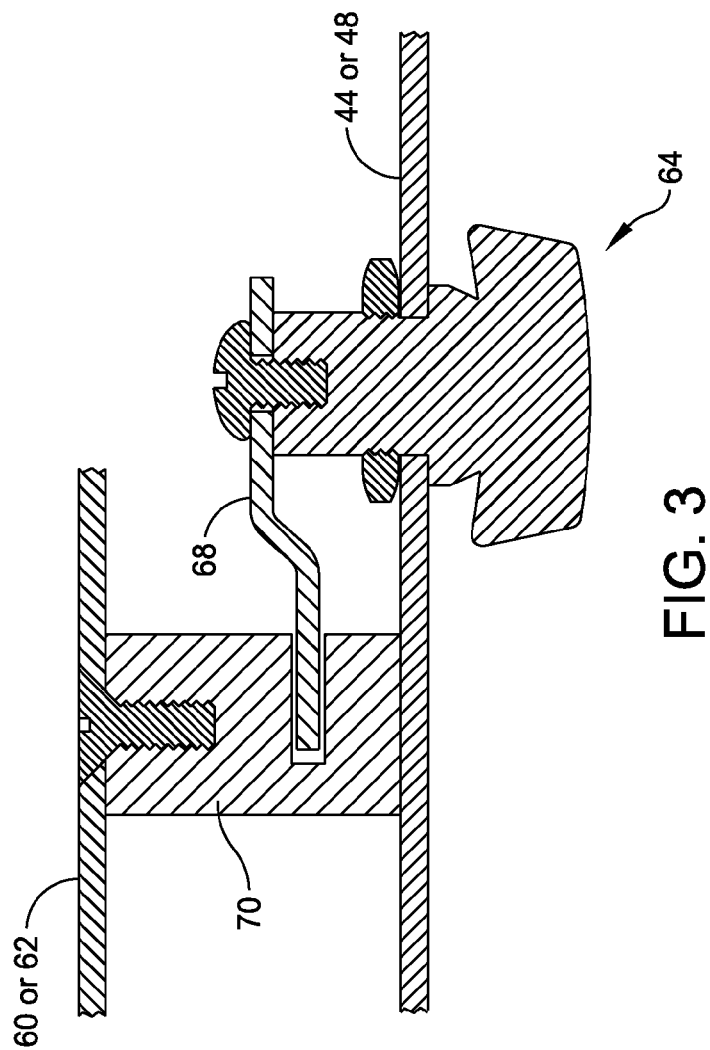
FIG. 3 is an enlarged cross-sectional view of a fastener assembly of one embodiment.

FIG. 2C illustrates another embodiment in which the right-hand second elongate frame assembly 28 secured to a wall 56, instead of being supported by an equipment rack. As shown, the third frame sub-assembly 40 is secured to the wall 56 in such a manner that the second elongate sub-assembly is positioned to support the ceiling panel 30. The principles disclosed herein may be applied to aisles defined by two rows of equipment racks, one row of equipment racks that is spaced from a wall or by two spaced-apart walls. In another embodiment, shown in FIG. 2D, the right-hand elongate frame assembly 28 can be replaced with a part 58, such as a C-channel, that is secured to the wall.

The second frame sub-assembly 38 of the first elongate frame assembly 26 further includes an upper lip 60 that extends over the first elongate support member 44 to prevent the sides of the ceiling panels 30 from moving vertically when supported by the first elongate support member. Similarly, the fourth frame sub-assembly 42 of the second elongate frame assembly 28 further includes an upper lip 62 that extends over the second elongate support member 48 to prevent the other sides of the ceiling panels 30 from moving vertically when supported by the second elongate support member.

The air containment system 22 further includes several lock assemblies, each generally indicated at 64, to maintain the first elongate support member 44 and the second elongate support member 48 in their horizontal conditions to support the ceiling panels 30. The arrangement is such that several lock assemblies 64 are spaced along the length of each first and second elongate frame assembly 26, 28 to support the first and second elongate support members in their horizontal conditions.

As shown in FIGS. 2A and 2B, the lock assembly 64 provided on the first elongate frame assembly 26 includes a mechanical fastener sub-assembly 66 having a first component 68, e.g., a latch, that is secured to the first elongate support member 44, and a second component 70, e.g., a holder or catch, that is secured to the upper lip 60 of the second frame sub-assembly 38 to support the first elongate support member 44 in the horizontal condition. By releasing the second component 70 from the first component 68, the first elongate support member 44 is free to pivot about the hinge 46 under its own weight to achieve the vertical condition shown in FIG. 2B.

The lock assembly 64 of the second elongate frame assembly 28 is similarly constructed in that it includes the mechanical fastener sub-assembly 66 having the first component 68 and the second component 70. As shown, when the first component 68 is released from the second component 70, the second elongate support member 48 is free to pivot about the hinge 50 under its own weight to achieve the vertical condition. When both the first and second elongate support members 44, 48 are released, the ceiling panels 30 are free to drop to the floor of the hot aisle 12. As stated above, the first elongate support member 44 and the second elongate support member 48 are identically configured so that when the lock assemblies 64 are released, the first and second elongate support members pivot about their respective hinges 46, 50 to release the ceiling panels 30.

Figure 5B:
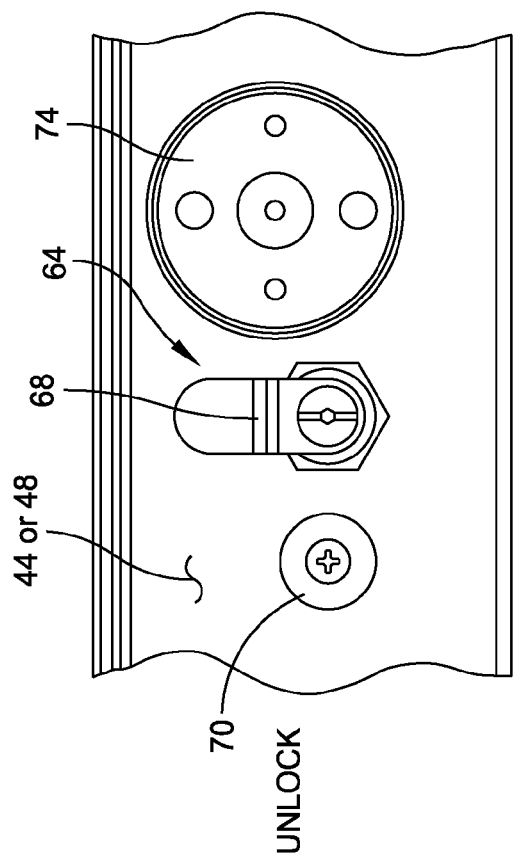
FIG. 5B is a top plan view of the fastener assembly with the fastener assembly being shown in an unlocked position.
Figure 5A:
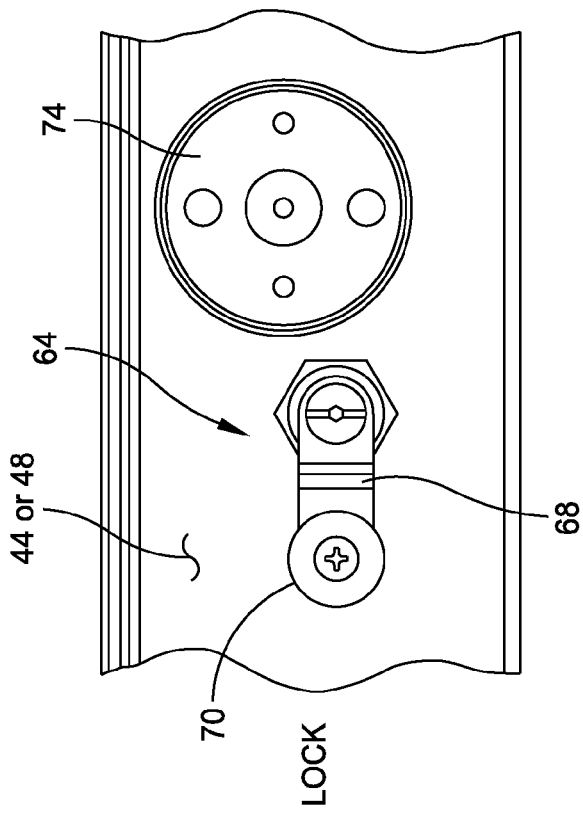
FIG. 5A is a top plan view of the fastener assembly with the fastener assembly being shown in a locked position.

Referring to FIGS. 3, 4, 5A and 5B, the operation of the mechanical fastener sub-assembly 66 of each lock assembly 64 will be described. As shown, the locking element or latch 68 is secured to the elongate support member 44 or 48 and the retaining element or catch 70 secured to the upper lip 60 or 62 of the elongate frame assembly 26 or 28. In another embodiment, the latch 68 may be secured to the upper lip 60 or 62 of the elongate frame assembly 26 or 28 and the catch 70 may be secured to the elongate support member 44 or 48. With reference to FIGS. 5A and 5B, the latch 68 of the mechanical fastener sub-assembly 66 is configured to move between a locked condition (FIG. 5A) in which the latch engages the catch 70 to retain the elongate support member 44 or 48 in close proximity to the elongate frame assembly 26 or 28 and an unlocked condition (FIG. 5B) in which the latch is disengaged from the catch to allow the elongate support member 44 or 48 to hingedly swing away from the elongate frame assembly 26 or 28. The rotation of the latch 68 of the mechanical fastener sub-assembly 66 may be achieved by manually manipulating the latch by and. In another embodiment, the latch 68 may be moved between the locked and unlocked conditions by any suitable mechanism configured to rotate the latch under the control of a controller.

Figure 6:
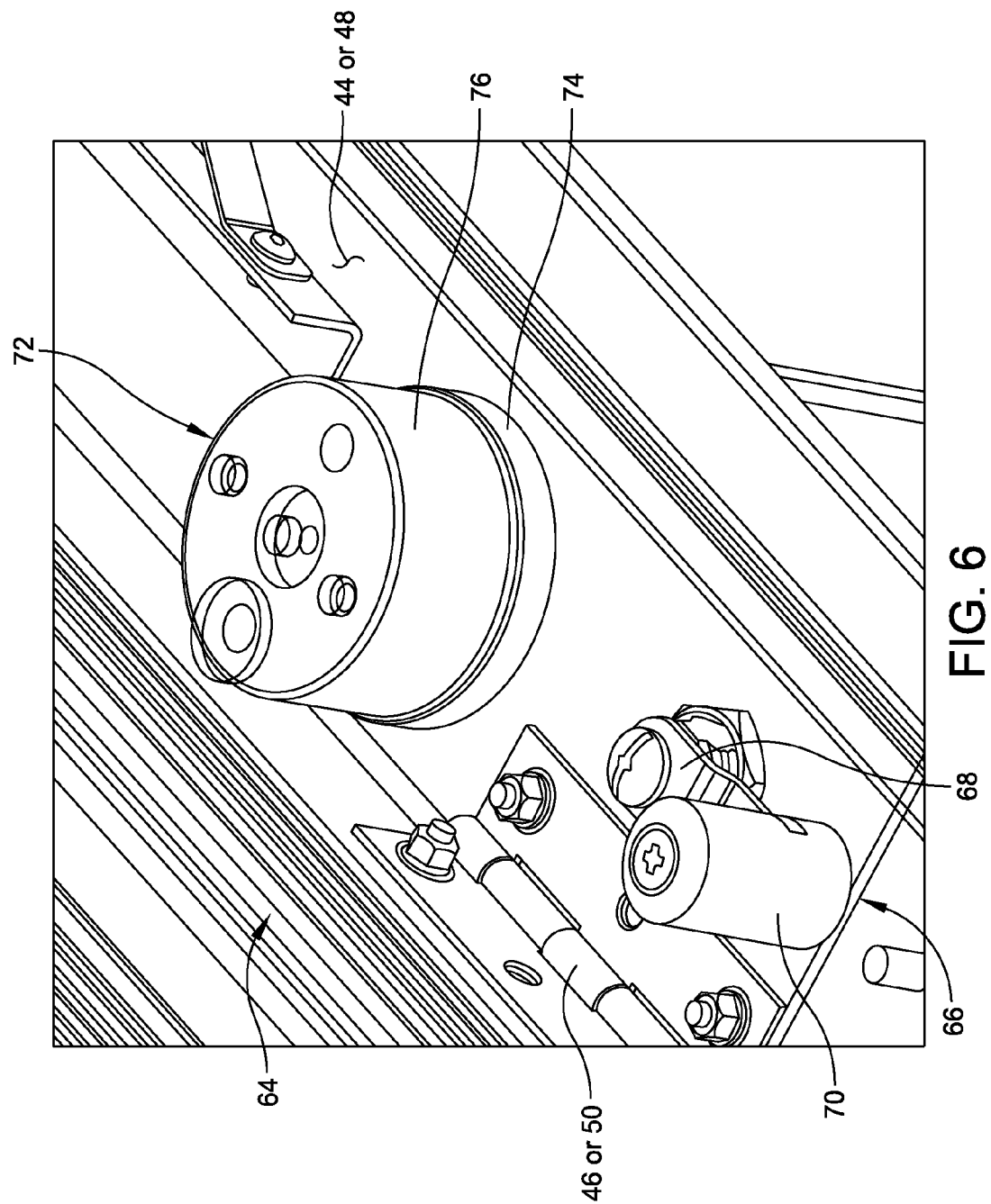
FIG. 6 is an enlarged top perspective view of a fastener assembly of another embodiment configured to release the ceiling panel upon detecting a predetermined condition.

With the mechanical fastener sub-assembly 66, the latch 68 and the associate catch 70 are manipulated by hand to secure the ceiling panels 30 to the elongate frame assemblies 26, 28. Referring to back to FIGS. 2A and 2B, with additional reference to FIG. 6, each fastener assembly 64 further includes an electro-magnetic lock sub-assembly 72 coupled to the elongate support member 44 or 48 and the elongate frame assembly 26, 28. Specifically, the electro-magnetic lock sub-assembly 72 includes a first portion 74 secured to the elongate support member 44 or 48 and a second portion 76 secured to the upper lip 60 or 62 of the elongate frame assembly 26, 28. The first and second portions 74, 76 of the electro-magnetic lock sub-assembly 72 are configured to be magnetically secured to one another to maintain the elongate support member 44 or 48 in the horizontal condition suitable to support the ceiling panels 30 and de-magnetized from one another to enable the elongate support member to move to the vertical condition to enable the ceiling panels to drop from the frame structure 24. In one embodiment, the first portion 74 may include a base metal material that is attracted to a magnet. The second portion 76 may include a magnet that is capable of being selectively energized to attract to the first portion 74.

The operation of the electro-magnetic lock sub-assembly 72 may be achieved by any suitable mechanism configured to magnetize and de-magnetize the second portion 76 (or alternatively the first portion 74) of the electro-magnetic lock sub-assembly. In certain embodiments, the electro-magnetic lock sub-assemblies 72 of the lock assemblies 64 may be activated upon the occurrence of a predetermined condition. For example, the predetermined condition may be the occurrence of a temperature within the hot aisle 12 that is greater than a set temperature. In one particular example, the set temperature may be 135° F. In one embodiment, the activation of the electro-magnetic lock sub-assemblies 72 of the lock assemblies 64 may coordinated to occur simultaneously so that the ceiling panels 30 drop at the same time. In such an embodiment, the second portions 76 of the electro-magnetic lock sub-assemblies 72 are de-magnetized simultaneously to release the ceiling panels 30. In other embodiments, when a predetermined condition occurs, an alarm may be triggered prior to activating the electro-magnetic lock sub-assemblies 72 of the fastener assemblies 64 to enable operators or other personnel within the aisle some time to exit the hot aisle 12. In order for the operation of the electro-magnetic lock sub-assembly 72 of each fastener assembly 64 to operate properly, i.e., to drop the ceiling panels 30 when a triggering event occurs, the mechanical fastener sub-assembly 66 must be moved to an unlocked position. Otherwise, the mechanical fastener sub-assembly 66 will prevent the ceiling panel 30 from dropping.

Figure 7:
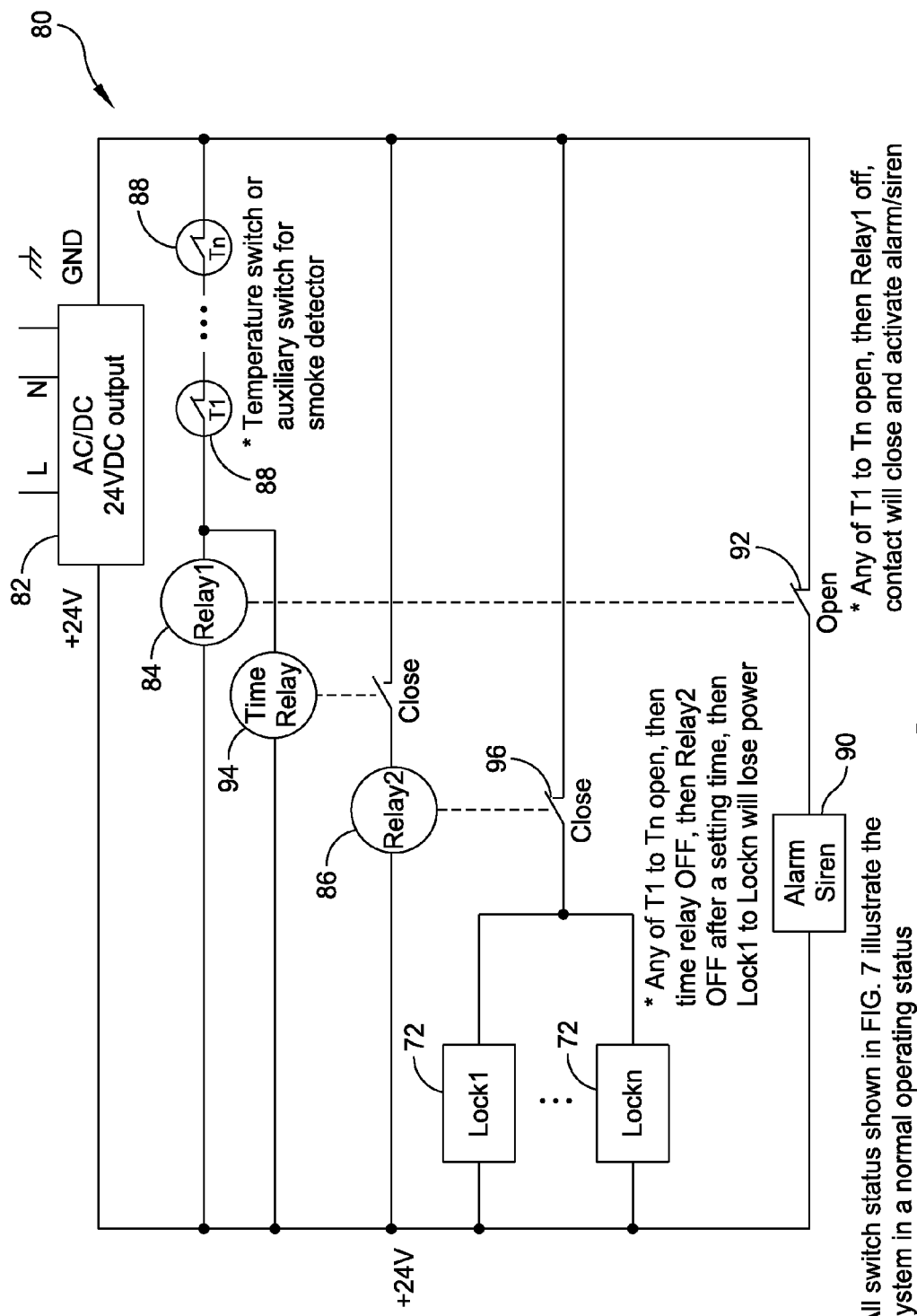
FIG. 7 is a schematic diagram of a lock control module of an embodiment of the disclosure.

Referring to FIG. 7, the air containment system further includes a control module, generally indicated at 80, to control the operation of the electro-magnetic lock sub-assemblies 72 to de-activate the sub-assemblies to drop the ceiling panels 30. Specifically, the control module 80 is configured to de-magnetize the electro-magnetic lock sub-assemblies 72 so that the first and second elongate support members 44, 48 are allowed to hingedly swing away from the first and second elongate frame assemblies 26, 28 about respective hinges 46, 50. As shown, the control module 80 includes an AC/DC converter 82 that is connected to the second portions 76 of the electro-magnetic fastener sub-assemblies by first and second relays 84, 86. Temperature sensors, each indicated at 88, are positioned between the AC/DC converter 82 and the first and second relays 84, 86. As further shown, the first relay 84 is connected to an alarm 90, which may be an audible and visual alarm, by a switch 92 that is normally in an open position. A time relay 94 is disposed between the AC/DC converter 82 and the second relay 86, which is connected to another switch 96 that is connected to the electro-magnetic fastener sub-assemblies. This switch 96 is normally in a closed to maintain the fastener assemblies 64 in a locked condition in which the ceiling panels 30 are supported by the first and second elongate support members 44, 48.

The arrangement is such that when a predetermined condition occurs, such as the temperature within the hot aisle 12 exceeding 135° F., or smoke being detected in the hot aisle, the first relay 84 closes the switch 92 connected to trigger the alarm 90, which may be a visual alarm, an audible alarm, or both. The time relay 94 enables a predetermined time to pass before the second relay 86 opens the switch 96 thus activating the fastener assemblies 64 to drop the ceiling panels 30. In one embodiment, the predetermined time may be seven seconds; however, any amount of time may be selected.

The air containment system 22 disclosed herein is particularly suited for performing a method of releasing one or more ceiling panels 30 upon detecting a predetermined condition. The method includes releasing the ceiling panels 30 upon detecting the predetermined condition, which may be an unsafe temperature, e.g., greater than 135° F., or smoke detected within the hot aisle 12 formed by the rows of racks 14, 16. The ceiling panels 30 are released by hingedly moving the first and second elongate support members 44, 48 with respect to the first and second elongate frame assemblies 26, 28, respectively. The control module 80 is configured to control the movement of the electro-magnetic lock sub-assemblies 72 of the fastener assemblies 64 between magnetized conditions in which the fastener assemblies retain the first and second elongate support members 44, 48 in close proximity to the first and second elongate frame assemblies 26, 28, respectively, and de-magnetized conditions in which the fastener assemblies disengage the first and second elongate support members to allow the first and second elongate support members to hingedly swing away from their respective first and second elongate frame assemblies. In one embodiment, an alarm 90 (visual and/or audible) is activated prior to releasing the ceiling panels 30 to enable persons within the hot aisle 12 to evacuate the hot aisle prior to dropping the ceiling panels.

As discussed above, the air containment system 22 of embodiments of the present disclosure may be positioned over two rows 14, 16 of equipment racks or between a row 14 of equipment racks and a wall 56. When positioned between a row 14 of equipment racks and the wall 56, the air containment system 22 may utilize the second elongate frame assembly 28 or a suitable part, such as part 58, to support the edge of the ceiling panel 30. When using a part 58, the ceiling panel 30 simply slides off the part when the air containment system 22 is activated upon detecting a predetermined event to drop the ceiling panel.

Thus, it should be observed that the air containment system 22 and method of operating the air containment system within the data center 10 as disclosed herein are particularly effective in automatically dropping a ceiling when a predetermined condition occurs. The systems and methods disclosed herein reduce the cost and installation time as compared to prior art systems. The systems and methods further are adapted to be installed in existing data centers without extraordinary customization. In this regard, the systems and methods are particularly suited for accommodating any aisle width or rack height.

Having thus described at least one embodiment of the present disclosure, various alternations, modifications and improvements will readily occur to those skilled in the art. Such alterations, modifications and improvements are intended to be within the scope and spirit of the disclosure. Accordingly, the foregoing description is by way of example only and is not intended to be limiting. The disclosure's limit is defined only in the following claims and equivalents thereto.

What is claimed is:

1. An air containment system configured to span an aisle formed by two rows of racks or by one row of racks and a wall to form a ceiling, the air containment system comprising:
a frame structure configured to be supported by the two rows of racks or by the one row of racks and the wall, the frame structure including a first elongate frame assembly extending along a length of a first row of the two rows of racks, a second elongate frame assembly extending along a length of a second row of the two rows of racks or the wall, and a first elongate support member hingedly connected to the first elongate frame assembly;
at least one ceiling panel releasably supported by the frame structure; and
a lock assembly coupled to the frame structure and configured to release the at least one ceiling panel upon detecting a predetermined condition.

2. The air containment system of claim 1, wherein the lock assembly includes an electro-magnetic lock coupled to the first elongate support member and the first elongate frame assembly.

3. The air containment system of claim 2, wherein the electro-magnetic lock includes a first portion secured to the first elongate support member and a second portion secured to the first elongate frame assembly.

4. The air containment system of claim 3, wherein the first portion includes a base metal material that is attracted to a magnet and the second portion includes a magnet that is capable of being selectively energized to attract to the first portion.

5. The air containment system of claim 2, further comprising a control module to control the operation of the electro-magnetic lock.

6. The air containment system of claim 5, wherein the control module is configured to move the electro-magnetic lock between a magnetized condition in which the electro-magnetic lock retains the first elongate support member in close proximity to the first elongate frame assembly and a de-magnetized condition in which the electro-magnetic lock disengages the first elongate support member to allow the first elongate support member to hingedly swing away from the first elongate frame assembly.

7. The air containment system of claim 5, further comprising an alarm coupled to the control module and configured to activate prior to when the electro-magnetic lock disengages the first elongate support member.

8. The air containment system of claim 1, wherein the lock assembly includes a mechanical fastener coupled to the first elongate support member and the first elongate frame assembly.

9. The air containment system of claim 8, wherein the mechanical fastener is configured to move between a locked condition in which the mechanical fastener retains the first elongate support member in close proximity to the first elongate frame assembly and an unlocked condition in which the mechanical fastener disengages the first elongate support member to allow the first elongate support member to hingedly swing away from the first elongate frame assembly.

10. The air containment system of claim 9, wherein the mechanical fastener includes a retaining element secured to one of the first elongate frame assembly and the first elongate support member and a locking element secured to the other of the first elongate frame assembly and the first elongate support member.

11. The air containment system of claim 1, wherein the frame structure further includes a second elongate support member hingedly connected to the second elongate frame assembly.

12. A method of releasing one or more ceiling panels upon detecting a predetermined condition, the method comprising:
providing an air containment system configured to span an aisle formed by two rows of racks or by one row of equipment racks and a wall to form a ceiling, the air containment system comprising a frame structure configured to be supported by the two rows of racks or by the one row of equipment racks and the wall, at least one ceiling panel releasably supported by the frame structure, and a lock assembly coupled to the frame structure and configured to release the at least one ceiling panel upon detecting a predetermined condition, the frame structure including a first elongate frame assembly extending along a length of a first row of the racks, a second elongate frame assembly extending along a length of a second row of the racks or a wall, and a first elongate support member hingedly connected to the first elongate frame assembly;
detecting a predetermined condition; and
releasing the at least one ceiling panel,
wherein releasing the at least one ceiling panel includes hingedly moving the first elongate support member with respect to the first elongate frame assembly by the lock assembly.

13. The method of claim 12, wherein the predetermined condition is a temperature within the aisle greater than a set temperature or smoke detected within the aisle.

14. The method of claim 12, wherein the lock assembly includes an electro-magnetic lock secured to the first elongate support member and the first elongate frame assembly.

15. The method of claim 14, wherein releasing the at least one ceiling panel includes controlling the movement of the electro-magnetic lock between a magnetized condition in which the electro-magnetic lock retains the first elongate support member in close proximity to the first elongate frame assembly and a de-magnetized condition in which the electro-magnetic lock assembly disengages the first elongate support member to allow the first elongate support member to hingedly swing away from the first elongate frame assembly.

16. The method of claim 12, further comprising, prior to releasing the at least one ceiling panel, operating an alarm to warn individuals within the aisle.

17. The method of claim 16, wherein the alarm includes a visual alarm and/or a sound alarm.

* * * * *